United States Patent
Chen

(10) Patent No.: US 11,804,581 B2
(45) Date of Patent: Oct. 31, 2023

(54) WAVELENGTH CONVERSION WHEEL AND PROJECTION DEVICE

(71) Applicant: Coretronic Corporation, Hsin-Chu (TW)

(72) Inventor: Chih-Ming Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 107 days.

(21) Appl. No.: 17/195,644

(22) Filed: Mar. 9, 2021

(65) Prior Publication Data

US 2021/0280752 A1 Sep. 9, 2021

(30) Foreign Application Priority Data

Mar. 9, 2020 (CN) .......................... 202010155859.5

(51) Int. Cl.
*H01L 33/50* (2010.01)
*G03B 21/16* (2006.01)
(Continued)

(52) U.S. Cl.
CPC .......... *H01L 33/507* (2013.01); *G02B 26/008* (2013.01); *G03B 21/16* (2013.01);
(Continued)

(58) Field of Classification Search
CPC ... H01L 33/507; H01L 33/505; H01L 33/502; G02B 26/008; G03B 21/204; G03B 21/16
See application file for complete search history.

(56) References Cited

U.S. PATENT DOCUMENTS

| 2020/0004118 A1* | 1/2020 | Hsu ...................... G02B 26/008 |
| 2020/0150517 A1* | 5/2020 | Chang .................. G02B 5/0284 |

FOREIGN PATENT DOCUMENTS

| CN | 201358320 Y | 12/2009 |
| CN | 204118141 U | 1/2015 |

(Continued)

OTHER PUBLICATIONS

Lee et al. "Thermal conductivity of anodized aluminum oxide layer: The effect of electrolyte and temperature", Materials Chemistry and Physics 141 (2013) 680-685 (Year: 2013).*

(Continued)

*Primary Examiner* — Evan P Dzierzynski
*Assistant Examiner* — Nathaniel J Lee

(57) ABSTRACT

A wavelength conversion wheel includes a turnable disc, a wavelength conversion layer, a pressure ring, an anodized layer and a balance weight. The turnable disc has an inner ring portion and a ring-shaped irradiation portion. The ring-shaped irradiation portion is connected to an outer edge of the inner ring portion. The ring-shaped irradiation portion includes a wavelength conversion region. The wavelength conversion layer is disposed on the wavelength conversion region. The pressure ring presses against the inner ring portion and has a first surface facing away the turnable disc. The anodized layer is disposed on the first surface. The balance weight is disposed on the anodized layer, wherein the surface roughness of the anodized layer is 1 μm to 10 μm. The wavelength conversion wheel of the invention has better reliability. A projection device with the wavelength conversion wheel is further provided.

16 Claims, 6 Drawing Sheets

(51) Int. Cl.
    *G02B 26/00*     (2006.01)
    *G03B 21/20*     (2006.01)

(52) U.S. Cl.
    CPC .......... *G03B 21/204* (2013.01); *H01L 33/502* (2013.01); *H01L 33/505* (2013.01)

(56) References Cited

FOREIGN PATENT DOCUMENTS

| | | | |
|---|---|---|---|
| CN | 205829765 U | 12/2016 | |
| CN | 208937891 U | 6/2019 | |
| CN | 209265073 U | 8/2019 | |
| JP | 2005084623 A | 3/2005 | |
| JP | 2007258004 A | 10/2007 | |
| TW | 200916937 A | 4/2009 | |
| TW | 201520674 A | 6/2015 | |

OTHER PUBLICATIONS

Sanders, R.E., Jr., "Aluminum and Aluminum Alloys", Kirk-Othmer Encyclopedia of Chemical Technology, (Ed.), (2012), https://doi.org/10.1002/0471238961.0112211319200112.a01.pub3 (Year: 2012).*

* cited by examiner

WAVELENGTH CONVERSION WHEEL AND PROJECTION DEVICE

CROSS-REFERENCE TO RELATED APPLICATION

This application claims the priority benefit of China application No. 202010155859.5, filed on Mar. 9, 2020. The entirety of the above-mentioned patent application is hereby incorporated by reference herein and made a part of this specification.

FIELD OF THE INVENTION

The invention relates to a wavelength conversion wheel and a projection device, and more particularly to a wavelength conversion wheel and a projection device using the wavelength conversion wheel.

BACKGROUND OF THE INVENTION

The type of light source used in the projection device has evolved from ultra-high pressure mercury lamp (UHP lamp), light emitting diode (LED) to laser diode (LD) with the market demand for brightness, color saturation, service life, non-toxic environmental protection and the like of the projection device.

At present, a cost of high-brightness red laser diodes and green laser diodes is too high. In order to reduce the cost, a blue laser diode is usually used to excite a phosphor on a phosphor wheel to generate yellow light and green light, then a desired red light is filtered through a filter wheel, and then a blue light emitted by the blue laser diode is used to form the three primary colors of red, green and blue required for a projection image.

The phosphor wheel is an extremely important element in projection devices that currently use laser diodes as a light source. Since the phosphor wheel is a high-speed rotating element, it must have sufficient balance. Therefore, balancing glue would be added to the phosphor wheel to prevent the phosphor wheel from shaking out of balance during high-speed rotation. However, when the adhesion strength between the phosphor wheel and the balancing glue is insufficient, a phenomenon of dropping out may occur during high-speed rotation, which affects the product reliability of the phosphor wheel.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a wavelength conversion wheel with better reliability.

The invention provides a projection device, whose wavelength conversion wheel has better reliability.

Other advantages and objects of the invention may be further illustrated by the technical features broadly embodied and described as follows.

In order to achieve one or a portion of or all of the objects or other objects, a wavelength conversion wheel provided in an embodiment of the invention includes a turnable disc, a pressure ring, an anodized layer and a balance weight. The turnable disc has an inner ring portion and a ring-shaped irradiation portion. The ring-shaped irradiation portion is connected to an outer edge of the inner ring portion. The ring-shaped irradiation portion includes a wavelength conversion region. The pressure ring presses against the inner ring portion and has a first surface facing away the turnable disc. The anodized layer is disposed on the first surface. The balance weight is disposed on the anodized layer, wherein the surface roughness of the anodized layer is 1 µm to 10 µm.

In order to achieve one or a portion of or all of the objects or other objects, a projection device provided in an embodiment of the invention includes an illumination system, a light valve and a projection lens. The illumination system is adapted to provide an illumination beam. The light valve is disposed on a transmission path of the illumination beam to convert the illumination beam into an image beam. The projection lens is disposed on a transmission path of the image beam. The illumination system includes an excitation light source and the wavelength conversion wheel described above. The excitation light source is adapted to provide an excitation beam. The wavelength conversion wheel is disposed on a transmission path of an excitation beam. The wavelength conversion region of the wavelength conversion wheel is adapted to convert the excitation beam into a converted beam, and the plate of the wavelength conversion wheel is adapted to reflect the excitation beam or allow the excitation beam to pass through. The illumination beam includes the converted beam.

In the wavelength conversion wheel and the projection device of the embodiment of the invention, an anodized layer is disposed on the first surface of the pressure ring of the wavelength conversion wheel, and a surface of the anodized layer is roughened, the surface roughness is 1 µm to 10 µm. Therefore, when the balance weight is disposed on the anodized layer, the adhesion strength between the anodized layer and the balance weight may be improved to prevent the balance weight from dropping out during high-speed rotation, thereby making the wavelength conversion wheel have better reliability.

Other objectives, features and advantages of The invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
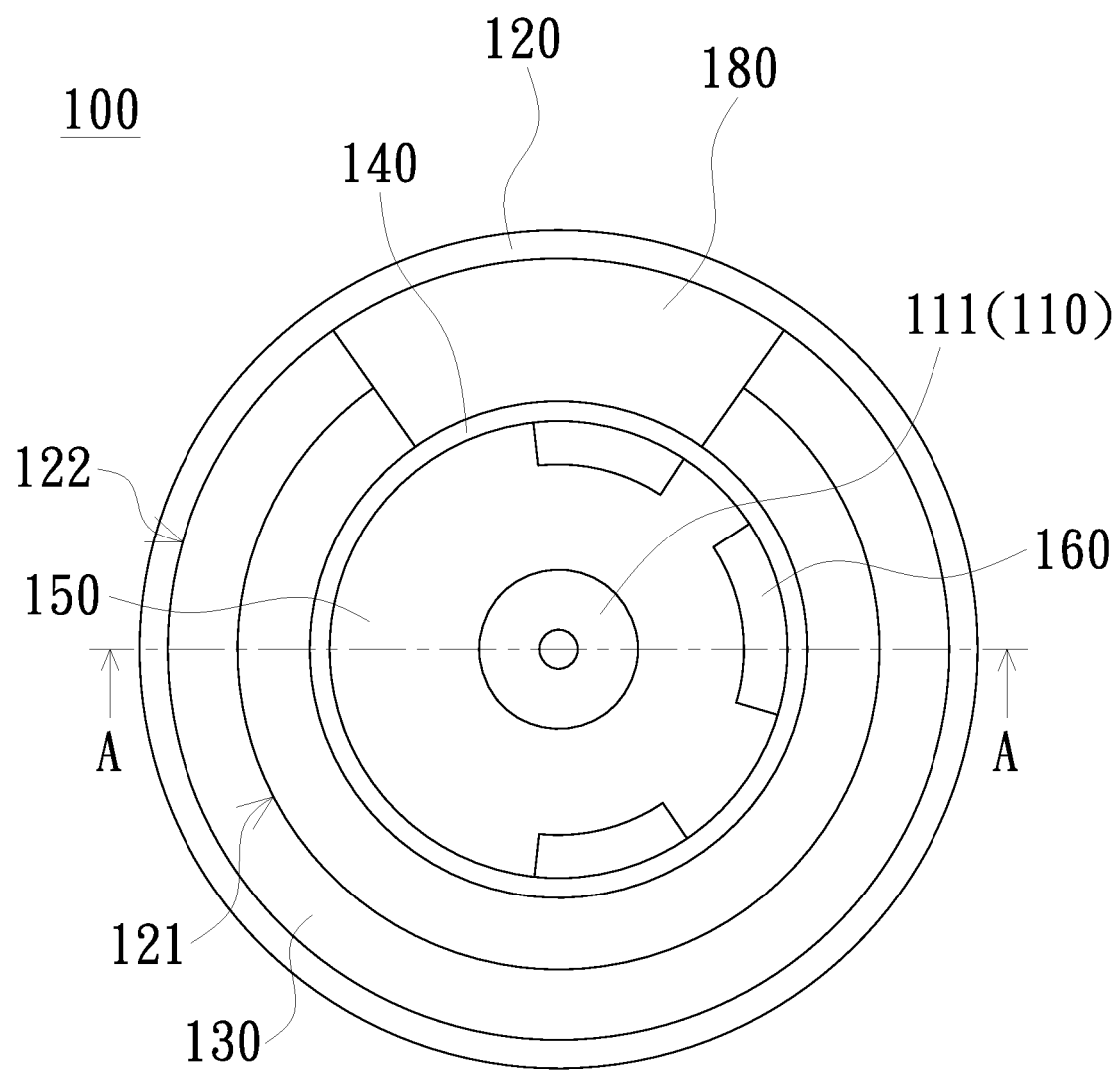
FIG. 1 is a schematic diagram of a wavelength conversion wheel of one embodiment of the invention.
Figure 2:
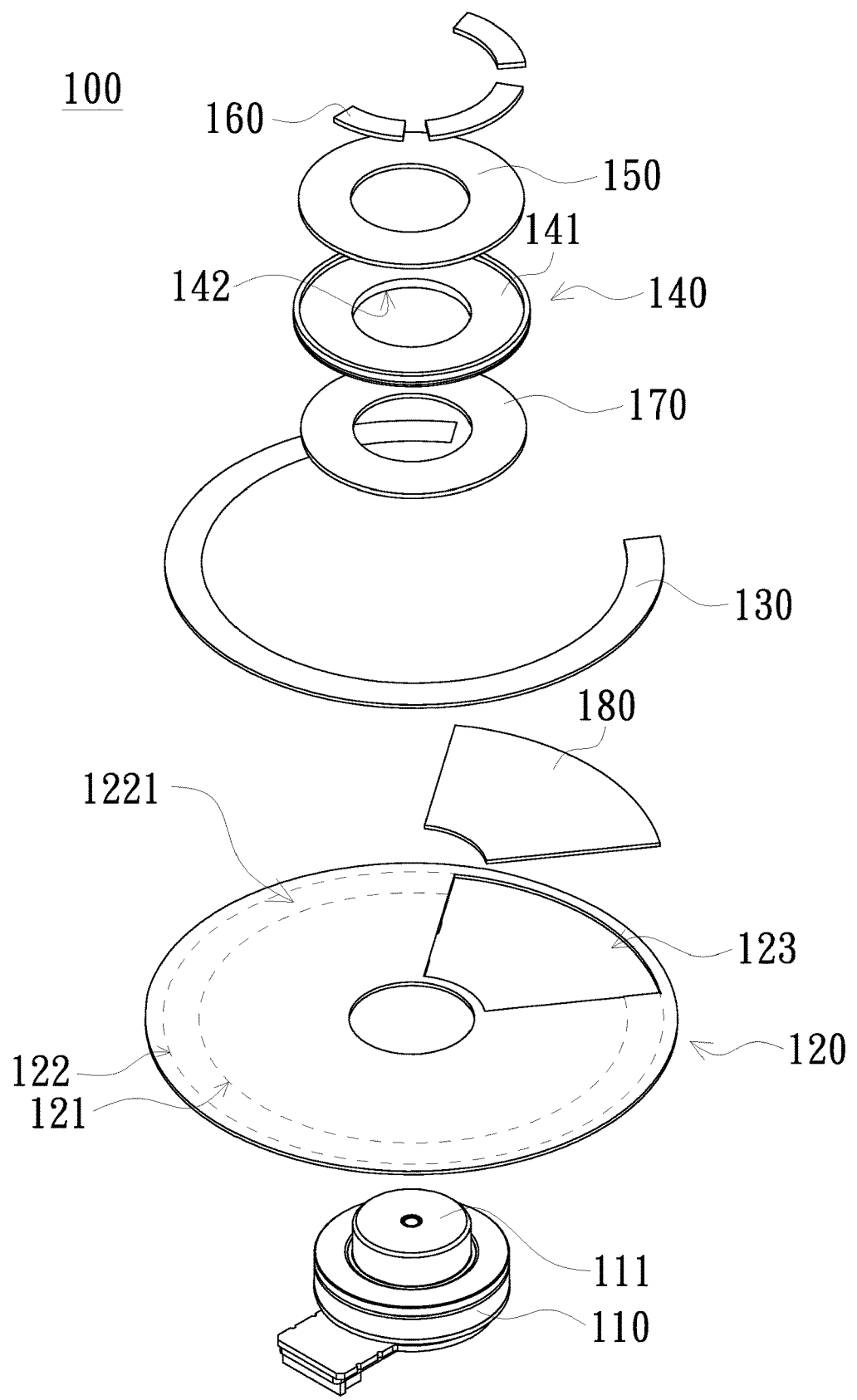
FIG. 2 is an exploded schematic diagram of FIG. 1.
Figure 3:
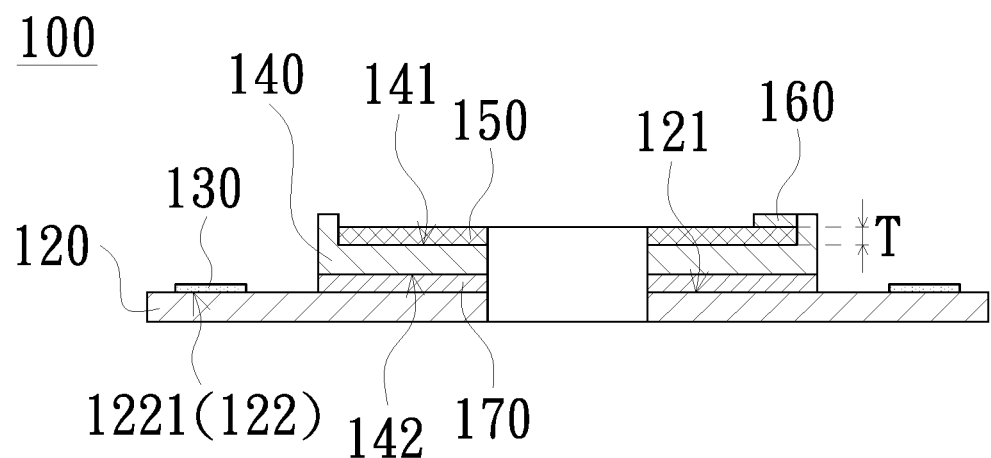
FIG. 3 is a partial cross-sectional schematic diagram of FIG. 1 along line A-A.

FIG. 1 is a schematic diagram of a wavelength conversion wheel of one embodiment of the invention. FIG. 2 is an exploded schematic diagram of FIG. 1. FIG. 3 is a partial cross-sectional schematic diagram of FIG. 1 along line A-A. Referring to FIG. 1 to FIG. 3, the wavelength conversion wheel 100 of the embodiment includes a driving part 110, a turnable disc 120, a wavelength conversion layer 130, a pressure ring 140, an anodized layer 150, and at least one balance weight 160. The driving part 110 is, for example, a motor. The driving part 110 has a rotating shaft 111 and is adapted to drive the turnable disc 120 to rotate. The turnable disc 120 is located between the driving part 110 and the pressure ring 140, and has an inner ring portion 121 and a ring-shaped irradiation portion 122. The material of the turnable disc 120 is, for example, metal, but is not limited thereto. The inner ring portion 121 has an opening to be sleeved on the rotating shaft 111. The ring-shaped irradiation portion 122 is connected to an outer edge of the inner ring portion 121. The ring-shaped irradiation portion 122 refers to an area that may be irradiated with an excitation light beam as the turnable disc 120 rotates. The ring-shaped irradiation portion 122 includes a wavelength conversion region 1221, and the wavelength conversion layer 130 is disposed on the wavelength conversion region 1221 and is adapted to receive an excitation beam. The material of the wavelength conversion layer 130 may be fluorescent materials, phosphorescent materials such as phosphors, or nano-materials such as quantum dots, but is not limited thereto. The wavelength conversion region 1221 may also include a plurality of regions, and the plurality of regions is respectively disposed with wavelength conversion materials that may be excited to emit light beams of different colors. The pressing ring 140 is sleeved on the rotating shaft 111 and presses against a part of the inner ring portion 121. The pressure ring 140 has a first surface 141 and a second surface 142 opposite to the first surface 141. The first surface 141 is facing away the turnable disc 120 and the second surface 142 faces the inner ring portion 121 of the turnable disc 120. The anodized layer 150 is disposed on the first surface 141, and the surface roughness of the anodized layer 150 is, for example, 1 μm to 10 μm. The balance weight 160 is disposed on the anodized layer 150 by adhesion, for example. In one embodiment, a glue layer may be used to bond the balance weight 160 to the anodized layer 150, but is not limited thereto.

The pressure ring 140 is a metal pressure ring, and the material includes at least one of aluminum, aluminum alloy, magnesium, magnesium alloy, titanium, and titanium alloy, but is not limited thereto. Specifically, the anodized layer 150 is formed on the first surface 141 of the pressing ring 140 after undergoing an electrochemical process (for example, anodizing treatment) to form a surface microporous oxide layer or a surface roughened oxide layer on the surface. For example, it is formed by plasma electrolytic oxidation or micro-arc oxidation, but is not limited thereto. When the pressing ring 140 uses the above material, the anodized layer 150 formed by the anodizing treatment comprises, for example, a ceramic structure layer. In addition, depending on the manufacturing process, the surface of the anodized layer 150 may, for example, have micropores (not shown), but is not limited thereto. The micropores also help to increase the surface roughness of the anodized layer 150.

Figure 4:
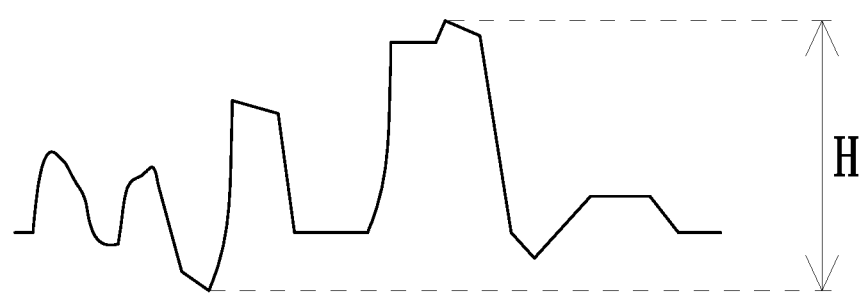
FIG. 4 is a schematic diagram of the surface roughening of an anodized layer of one embodiment of the invention.

Surface roughness refers to the unevenness of the processed surface which has small pitch and micro peaks and valleys. In the embodiment, the surface roughness is 1 μm to 10 μm, that is, a distance H between the lowest valley and the highest peak of the surface, as shown in FIG. 4, but is not limited thereto.

The balance weight 160 is, for example, balance soil having a glue layer or balance glue, but is not limited thereto. The quantity of the balance weight 160 is, for example, one or more, and may be adhered to the anodized layer 150 through a glue layer or the self-adhesiveness (balance glue itself). In addition, according to the requirements of the dynamic balance weight, the size of each balance weight 160 and the arrangement position on the anodized layer 150 may be adjusted.

In the embodiment, the thermal conductivity of the anodized layer 150 is, for example, 0.5 to 10 W/(m·K), but is not limited thereto. In addition, the thermal conductivity of the anodized layer 150 is, for example, less than the thermal conductivity of the turnable disc 120, so that the thermal conductivity of the pressure ring 140 is less than the thermal conductivity of the turnable disc 120. In order to clearly understand the thermal energy conduction path, please continue to refer to FIG. 3, in particular, the driving part 110 is not shown to make FIG. 3 concise. When the excitation beam irradiates the wavelength conversion layer 130 on the wavelength conversion region 1221, thermal energy is generated. Therefore, when the anodized layer 150 is formed on the first surface 141, the conduction of thermal energy to the balance weight 160 may be reduced. Specifically, the thermal energy conduction path sequentially transfers the thermal energy generated by the wavelength conversion layer 130 to the turnable disc 120, the pressure ring 140, the anodized layer 150 disposed on the pressure ring 140, and the balance weight 160. With the anodized layer 150 having a low thermal conductivity, the adhesion deteriorates of the balance weight 160 to the pressure ring 140 due to thermal energy may be reduced, and the problem of dropping out during high-speed rotation may also be reduced. To further explain, the anodized layer 150 with a low thermal conductivity may reduce the deterioration of bonding the weight 160 to the anodized layer 150 by thermal energy.

The wavelength conversion wheel 100 further includes, for example, an adhesive layer 170 adhered between the second surface 142 of the pressure ring 140 and the inner ring portion 121, so that the second surface 142 is attached to the inner ring portion 121.

The wavelength conversion wheel 100 further includes, for example, a plate 180, and the turnable disc 120 has, for example, a fan-shaped opening 123 (shown in FIG. 2) extending from the ring-shaped irradiation portion 122 to the inner ring portion 121. The plate 180 is embedded in the fan-shaped opening 123 and has a shape corresponding to the fan-shaped opening 123. The plate 180 includes, for example, a light reflecting element or a light transmissive element for reflecting the excitation beam or allowing the excitation beam to pass through. The plate 180 is, for example, a glass substrate, but is not limited thereto. When the plate 180 is used as a light reflecting member, for example, a reflective film may be coated on the glass substrate to achieve a reflection effect.

In the wavelength conversion wheel 100 of the embodiment, an anodized layer 150 is disposed on the first surface 141 of the pressure ring 140, and a surface of the anodized layer 150 is roughened, the surface roughness is 1 μm to 10 μm. Therefore, when the balance weight 160 is disposed on the anodized layer 150, the adhesion strength between the anodized layer 150 and the balance weight 160 may be improved. In the embodiment, the adhesion strength between the anodized layer 150 and the balance weight 160 is above 0.5 kg/mm$^2$. Compared with the known wavelength conversion wheel without anodized layer 150, the adhesion strength of the embodiment may be increased by more than 28% to prevent the balance weight 160 from dropping out during high-speed rotation, thereby making the wavelength conversion wheel 100 have better reliability.

Figure 5:
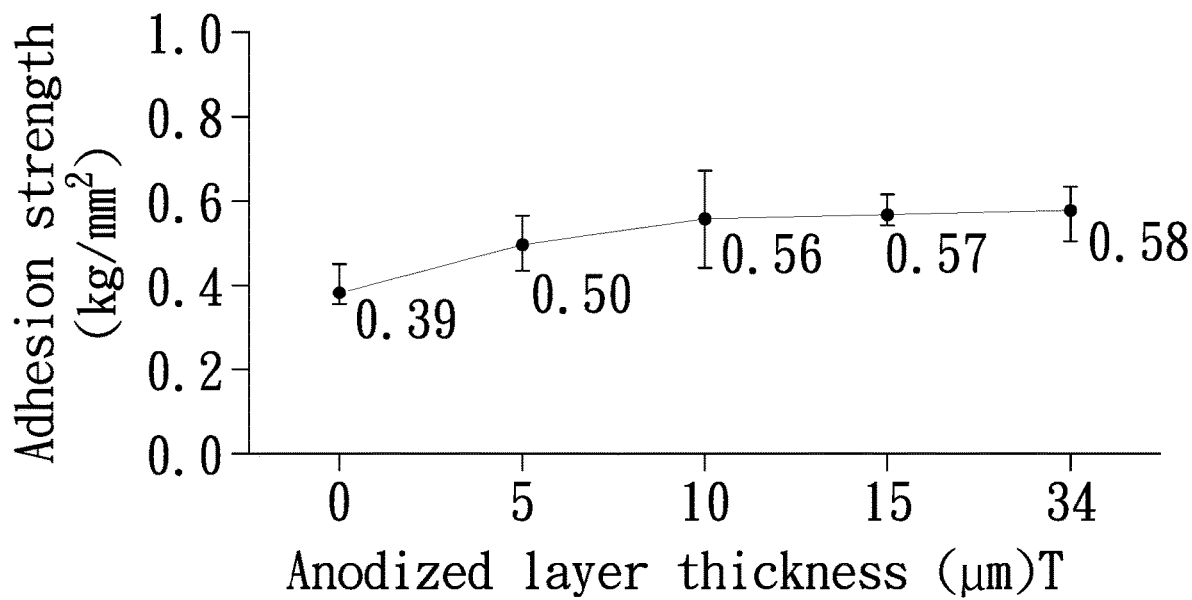
FIG. 5 is experimental results of adhesion strength between the anodized layer and the balance weight of one embodiment of the invention.

FIG. 5 is experimental results of adhesion strength between the anodized layer and the balance weight of one embodiment of the invention. It can be seen from FIG. 5 that after the anodized layer 150 is formed on the pressing ring 140, the average adhesion strength with the balance weight 160 may increase, and as the thickness T of the anodized layer 150 increases, the average adhesion strength (that is, adhesion) with the balance weight 160 also increases. The thickness T of the anodized layer 150 may refer to the label in FIG. 3. Although the thickness T in FIG. 5 is only listed to 34 μm, the invention is not limited to the above-mentioned embodiment. In order to achieve the above-mentioned adhesion effect, the anodized layer 150 of the embodiment has a design with a thickness T of 10 μm to 100 μm, for example. Further, FIG. 5 may show the average adhesion strength, maximum adhesion strength, and minimum adhesion strength when the thickness T of different anodized layers 150 is different.

Figure 6:
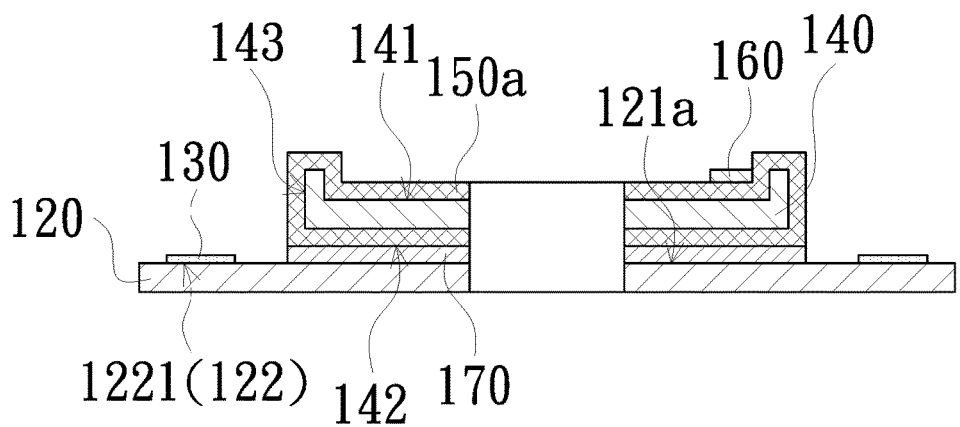
FIG. 6 is a cross-sectional schematic diagram of a wavelength conversion element of another embodiment of the invention.

FIG. 6 is a cross-sectional schematic diagram of a wavelength conversion element of another embodiment of the invention. Referring to FIG. 6, the wavelength conversion wheel 100a of the embodiment is similar in structure and advantages to the wavelength conversion wheel 100, the only difference is that in the wavelength conversion wheel 100a of the embodiment, the anodized layer 150a is further disposed on the second surface 142. Specifically, after the anodizing treatment is performed on the pressure ring 140, an anodized layer is formed on the surface of the pressure ring 140. Therefore, not only the first surface 141 and the second surface 142, the anodized layer 150a is also distributed on an annular side surface 143 connected between the first surface 141 and the second surface 142, that is, the anodized layer 150a completely covers the surface of the pressing ring 140. Since the thermal conductivity of the anodized layer 150a is smaller than the thermal conductivity of the turnable disc 120, when the anodized layer 150a is formed on the second surface 142, thermal energy generated when the excitation beam is irradiated on the wavelength conversion layer 130 of the wavelength conversion region 1221 may be further prevented from being conducted along the turnable disc 120 to the balance weight 160 disposed on the anodized layer 150a, let the balance weight 160 be deteriorated due to heat, and drop out during high-speed rotation of the wavelength conversion wheel 100a. In addition, the anodized layer 150a disposed on the second surface 142 may increase the adhesion strength with the adhesive layer 170, thereby making the wavelength conversion wheel 100a have better reliability.

Figure 7:
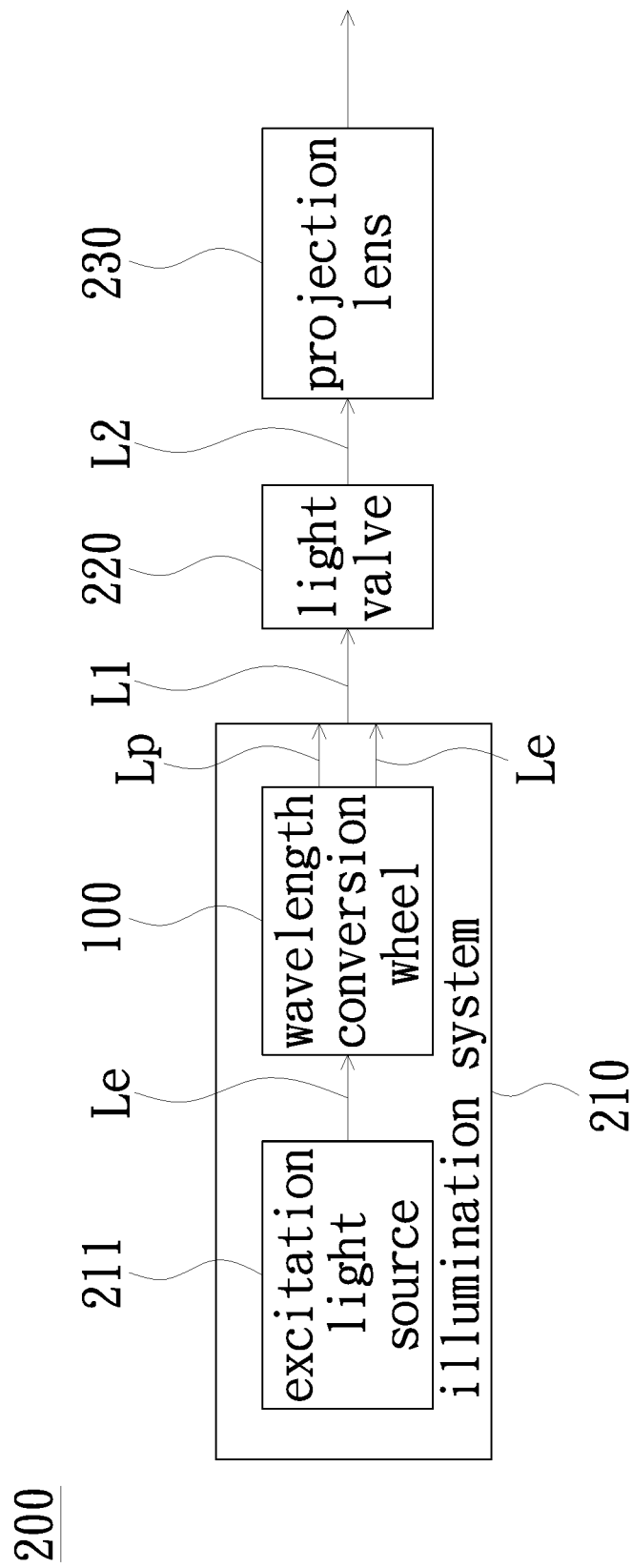
FIG. 7 is a block diagram of a projection device of one embodiment of the invention.

FIG. 7 is a block diagram of a projection device of one embodiment of the invention. Referring to FIG. 7, the projection device 200 of the embodiment includes an illumination system 210, a light valve 220 and a projection lens 230. The illumination system 210 is adapted to provide an illumination beam L1. The light valve 220 is disposed on the transmission path of the illumination beam L1 to convert the illumination beam L1 into an image beam L2. The projection lens 230 is disposed on the transmission path of the image beam L2 to project the image beam L2 onto a screen or a wall, thereby forming an image screen on the screen or the wall. The light valve 220 may be a reflective light valve or a transmissive light valve, the transmissive light valve may be a transmissive liquid crystal panel, and the reflective light valve may be a digital micro-mirror device (DMD), a liquid crystal display (LCD), a liquid crystal on silicon panel (LCoS panel), a transparent liquid crystal panel, an electro-optical modulator, a magneto-optic modulator, an acousto-optic modulator (AOM), but is not limited thereto. The projection lens 230 includes, for example, a combination of one or more optical lenses having diopter, such as various combinations of non-planar lenses including biconcave lenses, lenticular lenses, meniscus lenses, convex and concave lenses, plano-convex lenses, and plano-concave lenses. In one embodiment, the projection lens 230 may also include a planar optical lens. The invention does not limit the type and kind of the projection lens 230.

Referring to FIG. 1 and FIG. 7, the illumination system 210 includes an excitation light source 211 and the wavelength conversion wheel 100. The excitation light source 211 is, for example, a diode module including a light emitting diode or a laser diode chip or a matrix composed of a plurality of diode modules to provide an excitation beam Le, but is not limited thereto. The wavelength conversion wheel 100 is disposed on a transmission path of the excitation beam Le. Although FIG. 5 takes the wavelength conversion wheel 100 of FIG. 1 as an example, the wavelength conversion wheel 100 may be replaced with the wavelength conversion wheel 100a.

The excitation beam Le is irradiated on the ring-shaped irradiation portion 122 of the wavelength conversion wheel 100. As the wavelength conversion wheel 100 rotates around the rotating shaft 111, the wavelength conversion layer 130 on the wavelength conversion region 1221 of the ring-shaped irradiation portion 122 is adapted to convert the excitation beam Le into the converted beam Lp. The converted beam Lp is reflected by the ring-shaped irradiation portion 122 of the turnable disc 120, and the wavelength of the converted beam Lp is different from the wavelength of the excitation beam Le. The plate 180 is adapted to reflect the excitation beam Le or allow the excitation beam Le to pass through. Therefore, the illumination beam L1 may include, but not limited to, the conversion beam Lp and the excitation beam Le reflected by the plate 180 or passing through the plate 180. The illumination system 210 may also include other optical elements to transmit the illumination beam L1 to the light valve 220. The specific embodiment of the illumination system 210 will be further described below with reference to the accompanying drawings, but the specific architecture of the illumination system of the invention is not limited to the embodiments listed below.

Figure 8:
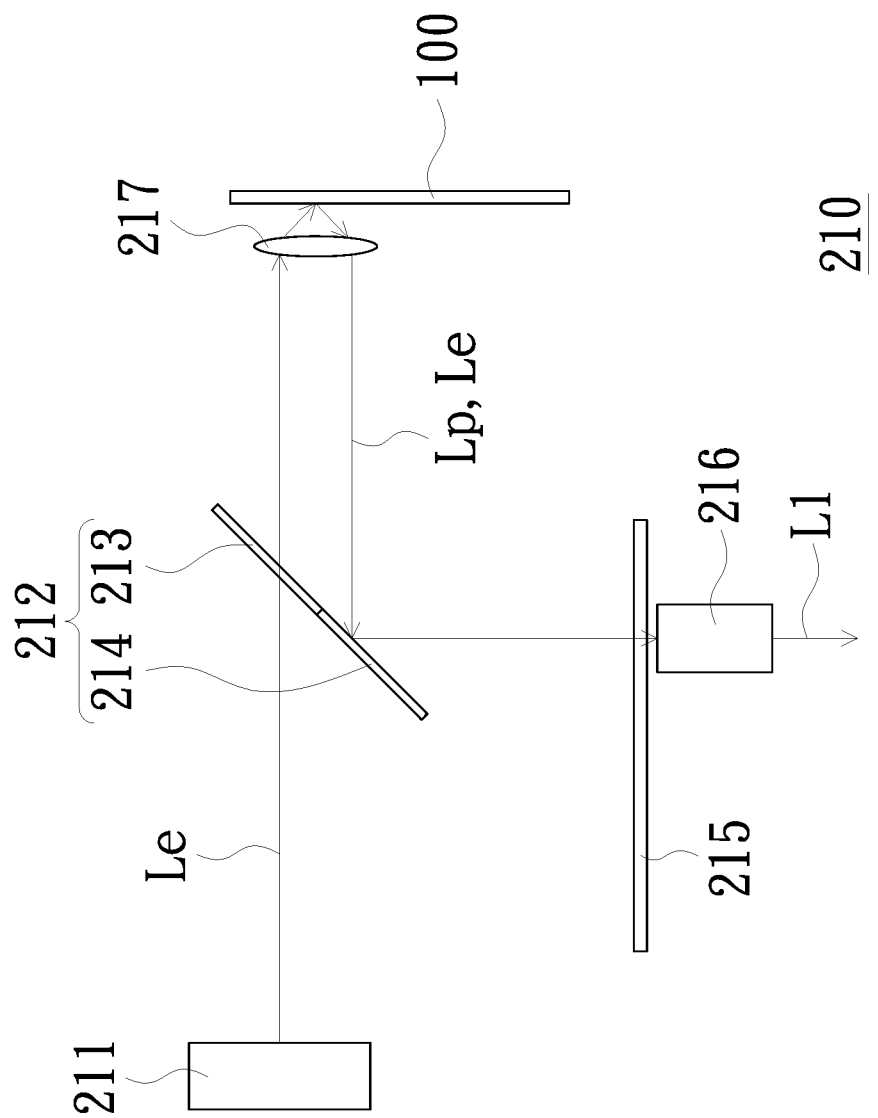
FIG. 8 is a schematic diagram of an illumination system of a projection device of one embodiment of the invention.

FIG. 8 is a schematic diagram of an illuminating system of a projection device of one embodiment of the invention. Referring to FIG. 7 and FIG. 8, the illumination system 210 of the embodiment may further include a beam combiner element 212, a filter wheel 215, a light homogenization element 216, and a condensing lens 217 in addition to the excitation light source 211 and the wavelength conversion wheel 100. The light homogenization element 216 may be a light integrating column, but is not limited thereto.

The beam combiner element 212 is disposed between the excitation light source 211 and the wavelength conversion wheel 100, and includes a color separation portion 213 and a reflection portion 214. The color separation portion 213 is adjacent to the reflection portion 214. The color separation portion 213 is adapted to allow the excitation beams Le to pass through and reflect the converted beam Lp, and the reflection portion 214 may reflect the excitation beams Le and the converted beam Lp. The condensing lens 217 is disposed between the light combining element 212 and the wavelength conversion wheel 100, and may condense the excitation beam Le to the wavelength conversion wheel 100. The condensing lens 217 may also condense the converted beam Lp and the excitation beam Le reflected by the wavelength conversion wheel 100. The excitation beam Le provided by the excitation light source 211 passes through the color separation portion 213 of the beam combiner element 212 and is transmitted to the wavelength conversion wheel 100, and the converted beam Lp and the excitation beam Le reflected from the wavelength conversion wheel 100 in sequence are transmitted to the beam combiner element 212. The excitation beam Le is reflected by the reflection portion 214 of the beam combiner element 212 and sequentially passes through the filter wheel 215 and the light homogenization element 216. The converted beam Lp is reflected by the reflection portion 214 and the color separation portion 213 of the beam combiner element 212, and sequentially passes through the filter wheel 215 and the light homogenization element 216. Therefore, the illumination beam L1 provided by the illumination system 210 includes the converted beam Lp and the excitation beam Le.

In summary, in the wavelength conversion wheel and the projection device of the embodiment of the invention, an anodized layer is disposed on the first surface of the pressure ring of the wavelength conversion wheel, and a surface of the anodized layer is roughened, the surface roughness is 1 μm to 10 μm. Therefore, when the balance weight is disposed on the anodized layer, the adhesion strength between the anodized layer and the balance weight may be improved to prevent the balance weight from dropping out during high-speed rotation, thereby making the wavelength conversion wheel have better reliability. In addition, since the thermal conductivity of the anodized layer is smaller than the thermal conductivity of the turnable disc, thermal energy generated when the excitation beam is irradiated on the wavelength conversion layer of the wavelength conversion region may be prevented from being conducted along the turnable disc to the balance weight disposed on the anodized layer, let the balance weight be deteriorated due to heat, and drop out during high-speed rotation of the wavelength conversion wheel, thereby also making the wavelength conversion wheel have better reliability.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first surface and the second surface are only used for distinguishing various elements and do not limit the number of the elements.

What is claimed is:

1. A wavelength conversion wheel, comprising:
a turnable disc, having an inner ring portion and a ring-shaped irradiation portion, wherein the ring-shaped irradiation portion is connected to an outer edge of the inner ring portion, and the ring-shaped irradiation portion comprises a wavelength conversion region;
a wavelength conversion layer, disposed on the wavelength conversion region;
a pressure ring, pressing against the inner ring portion and having a first surface and a second surface opposite to each other;
an anodized layer, disposed on the first surface, the second surface and an annular side surface of the pressure ring, the first surface facing away the turnable disc, and the annular side surface connected between the first surface and the second surface; and
a balance weight, disposed on the anodized layer, wherein the surface roughness of the anodized layer is 1 μm to 10 μm.

2. The wavelength conversion wheel according to claim 1, wherein a material of the pressure ring comprises at least one of aluminum, aluminum alloy, magnesium, magnesium alloy, titanium and titanium alloy.

3. The wavelength conversion wheel according to claim 1, wherein the anodized layer is formed by a process of plasma electrolytic oxidation or a process of micro-arc oxidation.

4. The wavelength conversion wheel according to claim 1, wherein the anodized layer comprises a ceramic structure layer.

5. The wavelength conversion wheel according to claim 1, wherein a thickness of the anodized layer is 10 μm to 100 μm.

6. The wavelength conversion wheel according to claim 1, wherein a thermal conductivity of the anodized layer is smaller than a thermal conductivity of the turnable disc.

7. The wavelength conversion wheel according to claim 1, wherein a thermal conductivity of the anodized layer is 0.5 to 10 W/(m·K).

8. The wavelength conversion wheel according to claim 1, further comprising a driving part, wherein the turnable disc is located between the driving part and the pressure ring, the second surface is attached to the inner ring portion, and the driving portion is adapted to drive the turnable disc to rotate.

9. A projection device, comprising:
an illumination system, providing an illumination beam;
a light valve, disposed on a transmission path of the illumination beam to convert the illumination beam into an image beam; and
a projection lens, disposed on a transmission path of the image beam,
wherein the illumination system comprises an excitation light source and a wavelength conversion wheel, the excitation light source provides an excitation beam, and the wavelength conversion wheel comprises:
a turnable disc, having an inner ring portion and a ring-shaped irradiation portion, wherein the ring-shaped irradiation portion is connected to an outer edge of the inner ring portion, and the ring-shaped irradiation portion comprises a wavelength conversion region;
a wavelength conversion layer, disposed on the wavelength conversion region;
a pressure ring, pressing against the inner ring portion and having a first surface and a second surface opposite to each other;
an anodized layer, disposed on the first surface, the second surface and an annular side surface of the pressure ring, the first surface facing away the turnable disc, and the annular side surface connected between the first surface and the second surface; and
a balance weight, disposed on the anodized layer, wherein the surface roughness of the anodized layer is 1 μm to 10 μm,
wherein the wavelength conversion device is disposed on a transmission path of the excitation beam, the wavelength conversion layer of the wavelength conversion device is adapted to convert the excitation beam into a converted beam, and the illumination beam comprises the converted beam and the excitation beam.

10. The projection device according to claim 9, wherein a material of the pressure ring comprises at least one of aluminum, aluminum alloy, magnesium, magnesium alloy, titanium and titanium alloy.

11. The projection device according to claim 9, wherein the anodized layer is formed by a process of plasma electrolytic oxidation or a process of micro-arc oxidation.

12. The projection device according to claim 9, wherein the anodized layer comprises a ceramic structure layer.

13. The projection device according to claim 9, wherein a thickness of the anodized layer is 10 μm to 100 μm.

14. The projection device according to claim 9, wherein a thermal conductivity of the anodized layer is smaller than a thermal conductivity of the turnable disc.

15. The projection device according to claim 14, wherein a thermal conductivity of the anodized layer is 0.5 to 10 W/(m·K).

16. The projection device according to claim 9, further comprising a driving part, wherein the turnable disc is located between the driving part and the pressure ring, the second surface is attached to the inner ring portion, and the driving portion is adapted to drive the turnable disc to rotate.

* * * * *